(12) United States Patent
Cheng et al.

(10) Patent No.: US 9,331,201 B2
(45) Date of Patent: May 3, 2016

(54) MULTI-HEIGHT FINFETS WITH COPLANAR TOPOGRAPHY BACKGROUND

(71) Applicant: GLOBALFOUNDRIES INC., Grand Cayman (KY)

(72) Inventors: Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 9 days.

(21) Appl. No.: 13/906,428

(22) Filed: May 31, 2013

(65) Prior Publication Data

US 2014/0353752 A1    Dec. 4, 2014

(51) Int. Cl.

| H01L 29/78 | (2006.01) |
|---|---|
| H01L 29/66 | (2006.01) |
| H01L 21/8234 | (2006.01) |
| H01L 21/8238 | (2006.01) |
| H01L 21/84 | (2006.01) |
| H01L 27/12 | (2006.01) |

(52) U.S. Cl.
CPC ...... *H01L 29/785* (2013.01); *H01L 21/823431* (2013.01); *H01L 21/823821* (2013.01); *H01L 21/845* (2013.01); *H01L 27/1207* (2013.01); *H01L 27/1211* (2013.01); *H01L 29/66795* (2013.01)

(58) Field of Classification Search
CPC .................................................. H01L 29/785
See application file for complete search history.

(56) References Cited

U.S. PATENT DOCUMENTS

| 6,909,147 B2 | 6/2005 | Aller et al. |
|---|---|---|
| 7,196,380 B2 | 3/2007 | Anderson et al. |
| 7,256,078 B2 | 8/2007 | Anderson et al. |
| 7,709,893 B2 | 5/2010 | Bauer et al. |
| 7,781,273 B2 | 8/2010 | Schepis et al. |
| 8,101,994 B2 | 1/2012 | Yu et al. |
| 8,169,025 B2 | 5/2012 | Bedell et al. |
| 8,207,027 B2 | 6/2012 | Zhu et al. |
| 8,361,894 B1 | 1/2013 | Hargrove et al. |

(Continued)

OTHER PUBLICATIONS

U.S. Office Action dated Mar. 2, 2015 received in U.S. Appl. No. 14/029,352.

*Primary Examiner* — Peniel M Gumedzoe
*Assistant Examiner* — Christopher Johnson
(74) *Attorney, Agent, or Firm* — Scully, Scott, Murphy & Presser, P.C.

(57) ABSTRACT

A semiconductor structure is provided that has semiconductor fins having variable heights without any undue topography. The semiconductor structure includes a semiconductor substrate having a first semiconductor surface and a second semiconductor surface, wherein the first semiconductor surface is vertically offset and located above the second semiconductor surface. An oxide region is located directly on the first semiconductor surface and/or the second semiconductor surface. A first set of first semiconductor fins having a first height is located above the first semiconductor surface of the semiconductor substrate. A second set of second semiconductor fins having a second height is located above the second semiconductor surface, wherein the second height is different than the first height and wherein each first semiconductor fin and each second semiconductor fin have topmost surfaces which are coplanar with each other.

17 Claims, 7 Drawing Sheets

(56) References Cited

U.S. PATENT DOCUMENTS

| | | |
|---|---|---|
| 2004/0222477 A1 | 11/2004 | Aller et al. |
| 2008/0179682 A1 | 7/2008 | Bauer et al. |
| 2010/0041198 A1 | 2/2010 | Zhu et al. |
| 2011/0068375 A1 | 3/2011 | Jakschik et al. |
| 2011/0121406 A1 | 5/2011 | Lee et al. |
| 2013/0062699 A1 | 3/2013 | Zhu et al. |
| 2013/0320448 A1* | 12/2013 | Cappellani et al. ........... 257/365 |

* cited by examiner

MULTI-HEIGHT FINFETS WITH COPLANAR TOPOGRAPHY BACKGROUND

BACKGROUND

The present application relates to a non-planar semiconductor device and a method of forming the same. More particularly, the present application relates to a FinFET device and a method of forming the same.

With the increasing down-scaling of integrated circuits and increasingly demanded requirements for a higher speed of integrated circuits, transistors need to have higher drive currents with increasingly smaller dimensions. The use of non-planar semiconductor devices such as, for example, FinFETs, trigate and gate-all around semiconductor nanowire field effect transistors (FETs) is the next step in the evolution of complementary metal oxide semiconductor (CMOS) devices since such devices can achieve higher drive currents with increasingly smaller dimensions.

SUMMARY

In one aspect of the present application, a semiconductor structure is provided that contains semiconductor fins having variable heights without any undue topography. Specifically, a semiconductor structure is provided that includes a semiconductor substrate comprising a first semiconductor surface and a second semiconductor surface, wherein the first semiconductor surface is vertically offset and located above the second semiconductor surface. An oxide region is located directly on the first semiconductor surface and/or the second semiconductor surface. A first set of first semiconductor fins having a first height is located above the first semiconductor surface of the semiconductor substrate. A second set of second semiconductor fins having a second height is located above the second semiconductor surface, wherein the second height is different than the first height and wherein each first semiconductor fin and each second semiconductor fin has a topmost surface, and the topmost surfaces of the first and second semiconductor fins are coplanar with each other.

In one embodiment, the semiconductor structure includes a bulk semiconductor substrate comprising a first semiconductor surface and a second semiconductor surface, wherein the first semiconductor surface is vertically offset and located above the second semiconductor surface. A first oxide region is located directly on the first semiconductor surface and a second oxide region is located directly on the second semiconductor surface. In accordance with this embodiment of the present application, the first oxide region has a topmost surface that is vertically offset and located above a topmost surface of the second oxide region. A first set of first semiconductor fins having a first height is located directly on the topmost surface of the first oxide region and a second set of second semiconductor fins having a second height is located directly on the topmost surface of the second oxide region, wherein the second height is greater than the first height and wherein each first semiconductor fin and each second semiconductor fin has a topmost surface, and the topmost surfaces of the first and second semiconductor fins are coplanar with each other.

In another aspect of the present application, a method of forming a semiconductor structure containing semiconductor fins having variable heights without any undue topography is provided. Specifically, the method includes providing a semiconductor substrate comprising a first semiconductor surface and a second semiconductor surface, wherein the first semiconductor surface is vertically offset and located above the second semiconductor surface, and wherein a pair of spaced apart semiconductor mandrel structures is present on a portion of the first semiconductor surface of the semiconductor substrate. Next, an oxide region is formed on the first semiconductor surface and/or the second semiconductor surface. A first set of first semiconductor fins having a first height is formed from one sidewall surface of each semiconductor mandrel structure and located above the first semiconductor surface, and a second set of second semiconductor fins having a second height is formed from another sidewall surface of each semiconductor mandrel structure and located above the second semiconductor surface, wherein the second height is different than the first height, and wherein the first semiconductor fin and the second semiconductor fin each have a topmost surface and wherein the topmost surface of the first semiconductor fin coplanar with the topmost surface of the second semiconductor fin. Next, each semiconductor mandrel structure is removed from atop portions of the first semiconductor surface.

DETAILED DESCRIPTION

Figure 1:
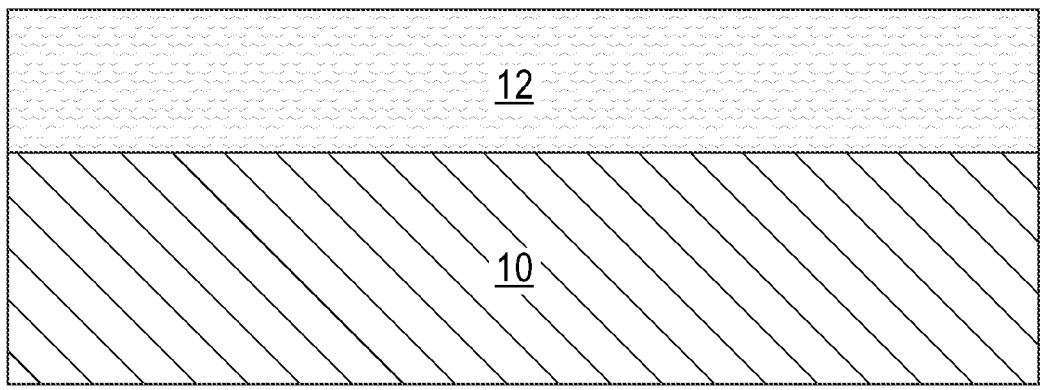
FIG. 1 is a pictorial representation (through a cross sectional view) illustrating an initial structure including a semiconductor substrate having a layer of a hard mask material located thereon in accordance with one embodiment of the present application.

The present application, which provides a FinFET device and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

A FinFET device is one architecture that can provide higher drive currents with increasingly smaller dimensions. As used throughout the present application, the term "fin" refers to a semiconductor material which is employed as the body of a semiconductor device, in which a gate structure straddles the semiconductor material such that charge flows along the channel on the two sidewalls of the semiconductor material and optionally along the top surface of the semiconductor material. One drawback of prior art FinFET devices is the device width quantization, i.e., the effective device width has to be an integral number of Fins. Width quantization puts severe constraints on device design, particularly for static random access memory (SRAM) devices in which it is highly desired to customize the ratio between pull-up, pull-down and pass gate transistors. In bulk FinFET devices, one could recess the shallow trench isolation region to get different Fin widths, but bulk FinFET devices have difficulty in achieving low leakage because bulk FinFET devices require junction isolation and thus have inherently high junction/gate induced drain leakage (GIDL).

Semiconductor-on-oxide (SOI) FinFET devices overcome the high leakage problem. However, the Fin width of an SOI FinFET device is predetermined by the thickness of the SOI layer, i.e., the topmost semiconductor layer of the SOI substrate. Starting with different SOI thickness causes topography which is undesirable for manufacturing. Another disadvantage of SOI FinFET devices is high substrate cost in comparison to bulk semiconductors.

The present application provides a method for forming SOI finFET devices starting with a bulk semiconductor substrate wherein various Fin heights can be achieved without introducing undesirable topography. In some embodiments, the present application provides a finFET SRAM in which nFET fins are taller than pFET fins. In other embodiments, the present application can provide SOI fins and bulk SOI fins on the same semiconductor substrate.

Referring first to FIG. 1, there is illustrated an initial structure including a semiconductor substrate 10 having a layer of a hard mask material 12 located thereon in accordance with one embodiment of the present application.

In accordance with the present application, the semiconductor substrate 10 that is employed in the present application is a bulk semiconductor substrate. By "bulk" it is meant the entirety of the semiconductor substrate 10 from one surface to an opposite surface is composed of a semiconductor material. The semiconductor substrate 10 can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the semiconductor substrate 10. In one embodiment, the semiconductor substrate 10 comprises a single crystalline semiconductor material, such as, for example, single crystalline silicon. In other embodiments, the semiconductor substrate 10 may comprise a polycrystalline or amorphous semiconductor material.

In some embodiments of the present application, the semiconductor substrate 10 may be doped, undoped or contain doped and undoped regions therein. For clarity, the doped regions are not specifically shown in the drawings of the present application. Each doped region within the semiconductor material may have the same, or they may have different conductivities and/or doping concentrations. The doped regions that are present in the semiconductor material of semiconductor substrate 10 can be formed utilizing a conventional ion implantation process or gas phase doping.

The initial structure shown in FIG. 1 also includes a layer of hard mask material 12 present on an exposed surface of the semiconductor substrate 10. The layer of hard mask material 12 can be comprised of a dielectric hard mask material such as, for example, an oxide, nitride, and/or oxynitride. In one embodiment, the layer of hard mask material 12 can be comprised of silicon oxide, a silicon nitride and/or a silicon oxynitride. In one embodiment, the layer of hard mask material 12 can be formed utilizing a thermal process such as, for example, a thermal oxidation or a thermal nitridation process. In another embodiment, the layer of hard mask material 12 can be formed by a deposition process such as, for example, chemical vapor deposition (CVD), or plasma enhanced chemical vapor deposition (PECVD). The thickness of the layer of hard mask material 12 can be from 5 nm to 50 nm, although lesser and greater thicknesses can also be employed.

Figure 2:
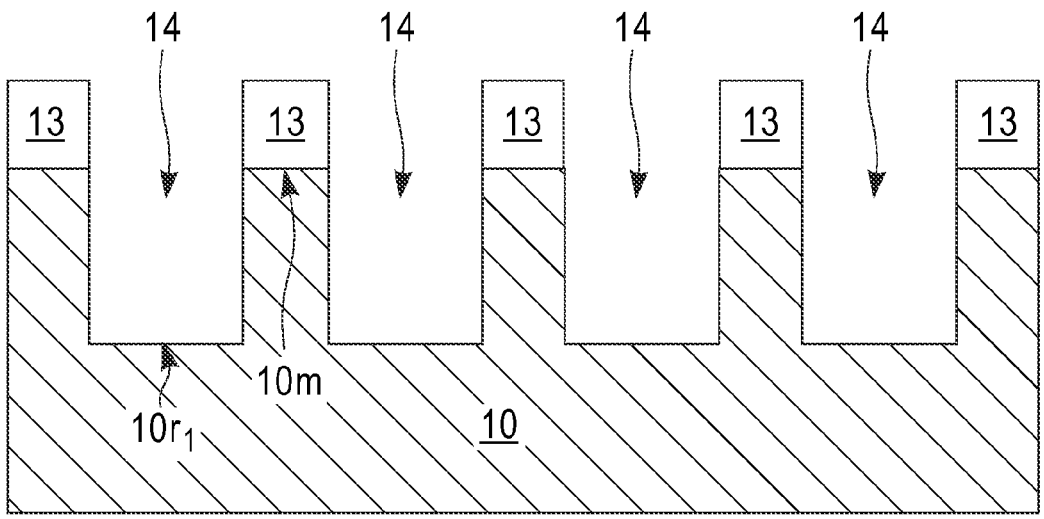
FIG. 2 is a pictorial representation (through a cross sectional view) illustrating the initial structure of FIG. 1 after forming a plurality of openings through the layer of hard mask material and into a portion of the semiconductor substrate.

Referring now to FIG. 2, there is illustrated the initial structure of FIG. 1 after forming a plurality of openings 14 through the layer of hard mask material 12 and into a portion of the semiconductor substrate 10. The remaining portions of the layer of hard mask material 12 are hereinafter referred to as hard mask material portions 13.

The plurality of openings 14 can be formed by lithography and etching. Lithography can include forming a photoresist (not shown) on an exposed surface of the layer of hard mask material 14, exposing the photoresist to a desired pattern of radiation, and then developing the exposed photoresist with a conventional resist developer to provide a patterned photoresist atop the layer of hard mask material 12. At least one etch is then employed which transfers the pattern from the patterned photoresist through the layer of hard mask material 12 and into portions of the semiconductor substrate 10. In one embodiment, the etch used for pattern transfer may include a dry etch process such as, for example, reactive ion etching, plasma etching, ion beam etching and laser ablation. In another embodiment, the etch used for pattern transfer may include a wet chemical etchant such as, for example, KOH or TMAH. In yet another embodiment, a combination of a dry etch and a wet chemical etch may be used to transfer the pattern. In one embodiment, the pattern is first transferred from the patterned photoresist into the layer of hard mask material 12, the patterned photoresist is then removed, and then the pattern is transferred from the now patterned layer of hard mask material into portions of the semiconductor substrate 10. In some embodiments, the patterned photoresist can remain throughout the entire transfer process. The patterned photoresist can be removed utilizing a conventional resist stripping process such as, for example, ashing.

After pattern transfer through the layer of hard mask material 12 and into portions of the semiconductor substrate 10, openings 14 are provided into the semiconductor substrate 10. Each opening 14 can have a first recessed surface $10r_1$ as compared to non-recessed surfaces of the semiconductor substrate 10. The non-recessed surfaces of the semiconductor substrate 10 can be referred to herein as mesa surfaces 10*m*. The mesa surfaces 10*m* represent the original topmost surface of semiconductor substrate 10. As is shown, hard mask material portions 13 are present on top of the mesa surfaces 10*m*. In some embodiments, and as shown, the hard mask material portions 13 have sidewall surfaces that are vertically coincident with sidewall surfaces of patterned semiconductor substrate 10 that are defined by each opening 14.

In one embodiment of the present application, each opening 14 can have a width, as measured from one exposed sidewall of the semiconductor substrate 10 to another exposed sidewall of the semiconductor substrate 10, of from 40 nm to 200 nm. In another embodiment of the present application, each opening 14 can have a width, as measured from one exposed sidewall of the semiconductor substrate 10 to another exposed sidewall of the semiconductor substrate 10, of from 40 nm to 120 nm.

In one embodiment of the present application, each opening 14 can have a depth, as measured from first recessed surface $10r_1$ to mesa surface 10*m*, of from 50 nm to 250 nm. In another embodiment of the present application, each opening 14 can have a depth, as measured from first recessed surface $10r_1$ to mesa surface 10*m* of from 50 nm to 100 nm.

Figure 3:
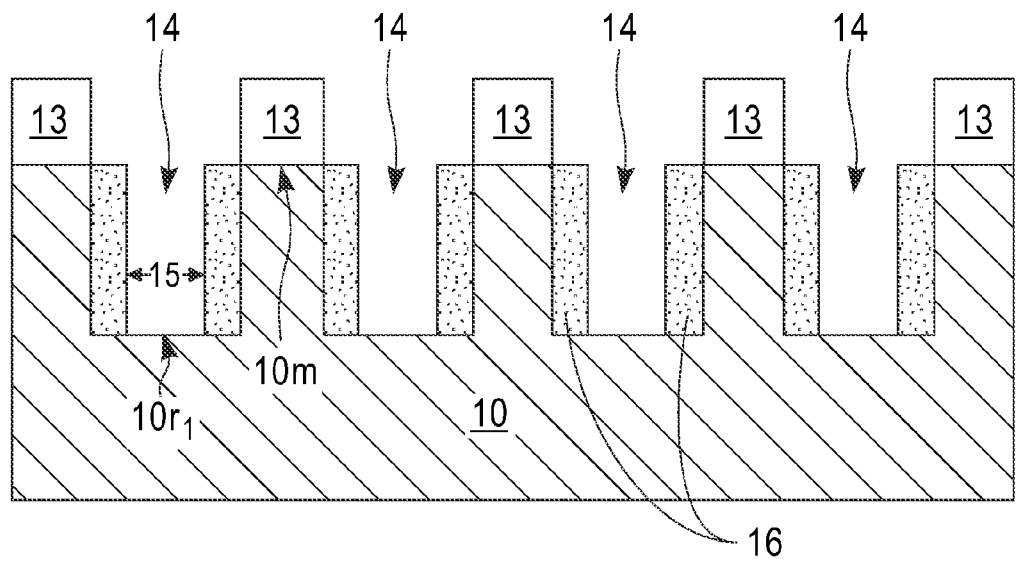
FIG. 3 is a pictorial representation (through a cross sectional view) illustrating the structure of FIG. 2 after forming semiconductor mandrel structures on exposed sidewall surfaces of the semiconductor substrate.

Referring now to FIG. 3, there is illustrated the structure of FIG. 2 after forming semiconductor mandrel structures 16 on exposed sidewall surfaces of the semiconductor substrate 10. As is shown, a pair of spaced apart semiconductor mandrel structures 16 is provided in each opening 14. Each semiconductor mandrel structure 16 that is formed has a bottommost surface on a portion of the first recessed surface $10r_1$ of the semiconductor substrate 10. As such, a gap 15 remains between each pair of spaced apart semiconductor mandrel structures 16 formed within each opening 14. As also shown, each semiconductor mandrel structure 16 has a topmost surface that is coplanar with the mesa surface 10*m* of the semiconductor substrate 10. Since hard mask material portions 13 are present atop the mesa surfaces, the semiconductor mandrel structures 16 do not extend upon the mesa surfaces 10*m* of the semiconductor substrate 10.

Each semiconductor mandrel structure 16 comprises a semiconductor material that differs from the semiconductor material of the semiconductor substrate 10. Examples of semiconductor materials that can be used in providing each semiconductor mandrel structure 16 include, but are not limited to, Si, Ge, SiGe, SiC, SiGeC, InAs, GaAs, InP or other like III/V compound semiconductors. In one embodiment of the present application, each semiconductor mandrel structure 16 may comprise a same semiconductor material which differs from the semiconductor material of the semiconductor substrate 10. In another embodiment of the present application, each semiconductor mandrel structure 16 may comprise a different semiconductor material, wherein each different semiconductor material providing the semiconductor mandrel structures 16 is different from the semiconductor material of the semiconductor substrate 10. In yet another embodiment, a first set of semiconductor mandrel structures 16 may comprise a same semiconductor material, while a second set of semiconductor mandrel structures 16 may comprise a different semiconductor material than the first set of semiconductor mandrel structures 16. In any of the various embodiments mentioned above, the semiconductor material used in providing the semiconductor mandrel structures 16 is different from the semiconductor material employed as the semiconductor substrate 10.

In one example of the present application, and when the semiconductor substrate 10 is comprised of silicon, the semiconductor mandrel structure 16 can be comprised of a silicon germanium alloy. In such an embodiment, the silicon germanium alloy that provides each semiconductor mandrel structure 16 can have a germanium content of from 30 atomic % germanium to 60 atomic % germanium. Other germanium contents for the silicon germanium alloy that provides each semiconductor mandrel structure 16 may also be used.

In some embodiments, each semiconductor mandrel structure 16 may be non-doped, i.e., comprise an intrinsic semiconductor material. In other embodiments, each semiconductor mandrel structure 16 is doped with an n-type of p-type dopant. In some embodiments, a first set of semiconductor mandrel structures 16 may be intrinsic, while a second set of semiconductor mandrel structures 16 may be doped.

Each semiconductor mandrel structure 16 is formed by an epitaxial growth (or epitaxial deposition) process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with an embodiment of the present application, each semiconductor mandrel structure 16 can be epitaxially grown at a temperature from 300° C. to 1000° C. using a gas mixture that includes at least one semiconductor source gas. In one example, each semiconductor mandrel structure 16 can be epitaxially grown at a temperature from 600° C. to 800° C. In one embodiment of the present application, each semiconductor mandrel structure 16 can be epitaxially grown utilizing low pressure chemical vapor deposition (LPCVD). In some embodiments of the present application, the process pressure is controlled in a way allowing only for deposition on (110) sidewalls to form each semiconductor mandrel structure 16, with no or almost no deposition on the first recessed surface $10r_1$. In one example, the process pressure can be 200 torr.

In one embodiment the crystal orientation dependence of the epitaxy process is used to form the semiconductor mandrel structures 16 on the exposed sidewalls of the semiconductor substrate 10 but not on the first recessed surface $10r_1$. For example, if the semiconductor substrate 10 is selected so that it has a top surface orientation of (110) and sidewall orientation of (100), epitaxy processes can be tailored so that the semiconductor mandrel structure 16 is deposited on the (100) sidewalls but not on the (110) recess.

In yet another embodiment, the semiconductor mandrel structure 16 can be deposited on the sidewalls of the semiconductor substrate 10 as well as the first recessed surface $10r_1$. An etch process such as, for example, reactive ion etching, can then be used to remove a portion of the semiconductor mandrel material that was deposited on the first recessed surface $10r_1$.

In yet another embodiment, the first recessed surface $10r_1$ of the semiconductor substrate 10 is modified before the epitaxy process such that the semiconductor mandrel structures 16 are not deposited on the first recessed surface $10r_1$. For example, ion implantation with a heavy ion such as Ge, Xe, or Si can be used to amorphize the semiconductor substrate at the first recessed surface $10r_1$. During the epitaxy process the semiconductor mandrel structure 16 is not deposited on the amorphized region or deposited in an amorphous or polycrystalline form and is removed in a cyclic deposition and etching epitaxy process.

In embodiments in which a dopant is present in the semiconductor mandrel structures 16, the dopant can be introduced during the epitaxial growth process or after epitaxial growth utilizing one of ion implantation, gas phase doping or cluster beam implantation. When the dopant is introduced during the epitaxial growth process, the epitaxial growth process can be referred to as an in-situ epitaxial growth process in which a dopant source, together with at least one semiconductor source, are used.

In one embodiment of the present application, the at least one semiconductor source gas used to form each semiconductor mandrel structure 16 may comprise a Si-containing precursor, such as, for example, a silane or a disilane, and/or a germanium-containing precursor such as, for example, a germane, $GeH_4$.

In embodiments when different semiconductor materials are used in forming the semiconductor mandrel structures 16, at least one first block can be formed on at least one region of the structure shown in FIG. 2, and with the at least one first block mask in place at least one semiconductor mandrel structure containing a first semiconductor material is formed by epitaxial growth. The at least one first block can then be removed and thereafter at least one second block mask can be formed in regions of the structure including the at least one semiconductor mandrel structure containing the first semiconductor material. With the at least one second block mask in place, a second epitaxial growth process can be performed to provide at least one second semiconductor mandrel structure containing a second semiconductor material that differs from the first semiconductor material. The at least one second block mask can then be removed.

In one embodiment, each semiconductor mandrel structure 16 that is formed has a width, as measured from one vertical sidewall surface to an opposing vertical sidewall surface, of from 10 nm to 60 nm. In another embodiment, each semiconductor mandrel structure 16 that is formed has a width, as measured from one vertical sidewall surface to an opposing vertical sidewall surface, of from 10 nm to 40 nm.

Figure 4:
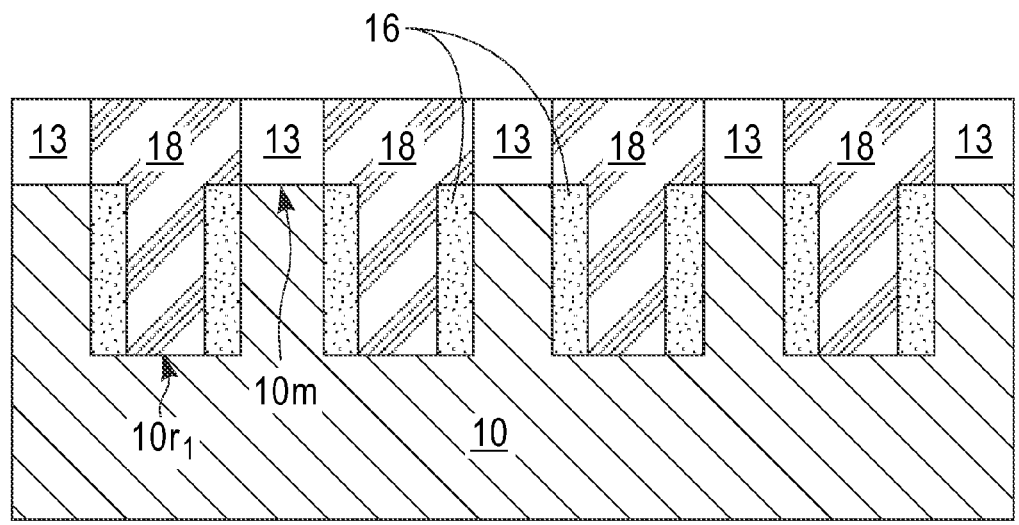
FIG. 4 is a pictorial representation (through a cross sectional view) illustrating the structure of FIG. 3 after filling remaining portions of the opening within the layer of hard mask material and the semiconductor substrate with a dielectric material that differs from the hard mask material.

Referring now to FIG. 4, there is illustrated the structure of FIG. 3 after filling remaining portions of each opening 14, including gap 15, with a dielectric material 18 that differs from the hard mask material. As is shown in FIG. 4, the dielectric material 18 contains portions that directly contact vertical sidewall surfaces of each semiconductor mandrel structure 16, other portions that directly contact the topmost surface of each semiconductor mandrel structure 16, and yet further portions that directly contact sidewall surfaces of each hard mask material portion 13.

In one embodiment, the dielectric material 18 can be comprised of silicon oxide, a silicon nitride and/or a silicon oxynitride, with the proviso that the dielectric material 18 differs from that used in providing the layer of hard mask material 12. In one example, and when the layer of hard mask material 12 is comprised of silicon nitride, then dielectric material 18 may be comprised of silicon oxide. In another example, and when the layer of hard mask material 12 is comprised of silicon oxide, then dielectric material 18 may be comprised of silicon nitride.

The filling of each opening 14 and gap 15 with dielectric material 18 can be obtained by deposition of the dielectric material 18 and then an optional planarization process can be used to provide the planar structure shown in FIG. 4. In one embodiment, the dielectric material 18 can be formed by a deposition process such as, for example, chemical vapor deposition (CVD), or plasma enhanced chemical vapor deposition (PECVD). In one embodiment, and when a planarization process is employed, the planarization process may comprise a chemical mechanical polishing or etch back process. As shown in FIG. 4, the topmost surface of each dielectric material 18 is coplanar with a topmost surface of each hard mask material portion 13.

Figure 5:
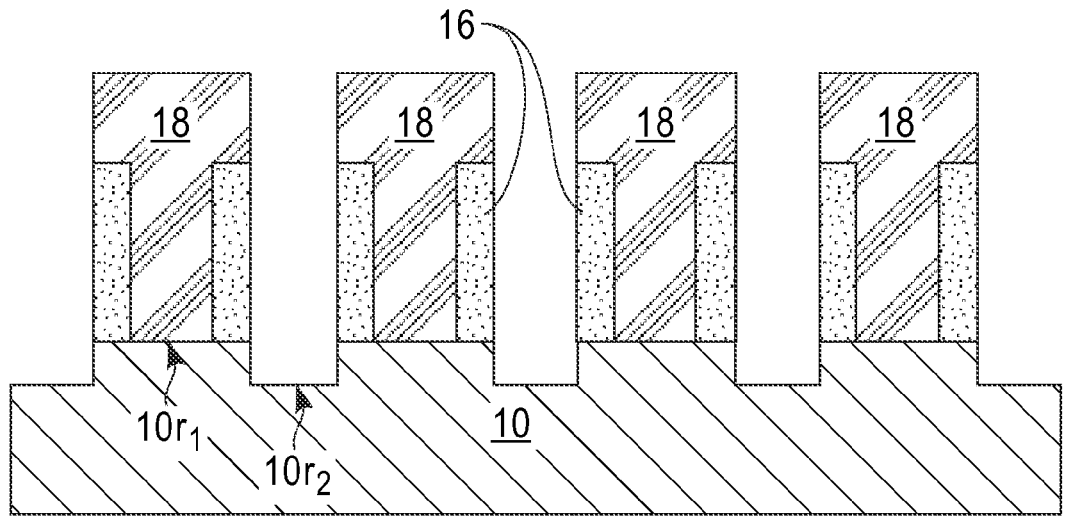
FIG. 5 is a pictorial representation (through a cross sectional view) illustrating the structure of FIG. 4 after removing remaining portions of the layer of hard mask material and recessing exposed portions of the semiconductor substrate to provide a second recessed surface below a first recessed surface of the semiconductor substrate which includes the semiconductor mandrel structures and the dielectric material.

Referring now to FIG. 5, there is illustrated the structure of FIG. 4 after removing each hard mask material portion 13 from atop the mesa surfaces $10m$ of the semiconductor substrate 10 and then recessing the exposed mesa surfaces $10m$ to provide second recessed surfaces $10r_2$ within semiconductor substrate 10. As is shown, each second recessed surface $10r_2$ is vertically offset and below each first recessed surface $10r_1$ that includes the semiconductor mandrel structures 16 and the dielectric material 18.

The removal of each hard mask material portion 13 can performed utilizing an etching process that selectively removes each hard mask material portion 13 relative to dielectric material 18. In one embodiment of the present application, a dry etch process such as, for example, a reactive ion etch, may be used to selectively remove each hard mask material portion 13 relative to dielectric material 18. In another embodiment of the present application, where the hard mask portion 13 is comprised of silicon nitride, a chemical wet etch process such as, for example, a hot phosphoric acid etch, may be used to selectively remove each hard mask material portion 13 relative to dielectric material 18.

After removing each hard mask material portion 13, each mesa surface $10m$ of the semiconductor substrate 10 is exposed. Each exposed mesa surface $10m$ is then recessed using dielectric material 18 as an etch mask to provide second recessed surface $10r_2$. As stated above, each second recessed surface $10r_2$ of the semiconductor substrate 10 is vertically offset and located beneath each first recessed surface $10r_1$. In one embodiment, the recessing of the mesa surfaces $10m$ to provide second recessed surfaces $10r_2$ may include a dry etching process such as, for example, a reactive ion etch. In another embodiment of the present application, a chemical wet etch process such as, for example, a KOH or TMAH etch, may be used to recess each mesa surface $10m$ to provide the second recessed surfaces $10r_2$.

Each first recessed surface $10r_1$ of the semiconductor substrate 10 may be referred to herein as a first semiconductor surface, while each second recessed surface $10r_2$ of semiconductor substrate 10 may be referred to herein as a second semiconductor surface. In accordance with the present application, the first semiconductor surface that is provided by the first recessed surface $10r_1$ is vertically offset and located above the second semiconductor surface that is provided by the second recessed surface $10r_2$. In accordance with the present application, the first and second semiconductor surfaces are connected to each other by a vertical sidewall portion of the semiconductor substrate 10. The semiconductor substrate 10 including the first semiconductor surface and the second semiconductor surface can be referred to herein as a feature-containing semiconductor substrate.

Figure 6:
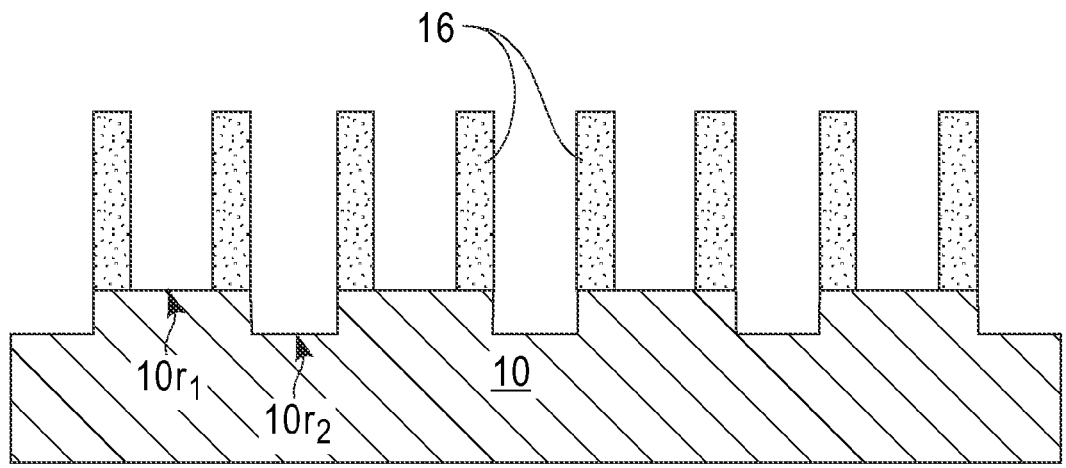
FIG. 6 is a pictorial representation (through a cross sectional view) illustrating the structure of FIG. 5 after removing the dielectric material from the structure.

Referring now to FIG. 6, there is illustrated the structure of FIG. 5 after removing the dielectric material 18 from the structure leaving semiconductor mandrel structures 16 atop portions of the first recessed surfaces $10r_1$ of semiconductor substrate 10. The removal of dielectric material 18 from the structure shown in FIG. 5 can be performed utilizing an etching process that selectively removes the dielectric material 18 relative to semiconductor material. In one embodiment of the present application, a dry etch process such as, for example, a reactive ion etch, may be used to selectively remove the dielectric material 18 relative to semiconductor material. In another embodiment of the present application, a chemical wet etch process such as, for example, an HF-based etch, may be used to selectively remove the dielectric material 18 relative to semiconductor material.

Figure 7:
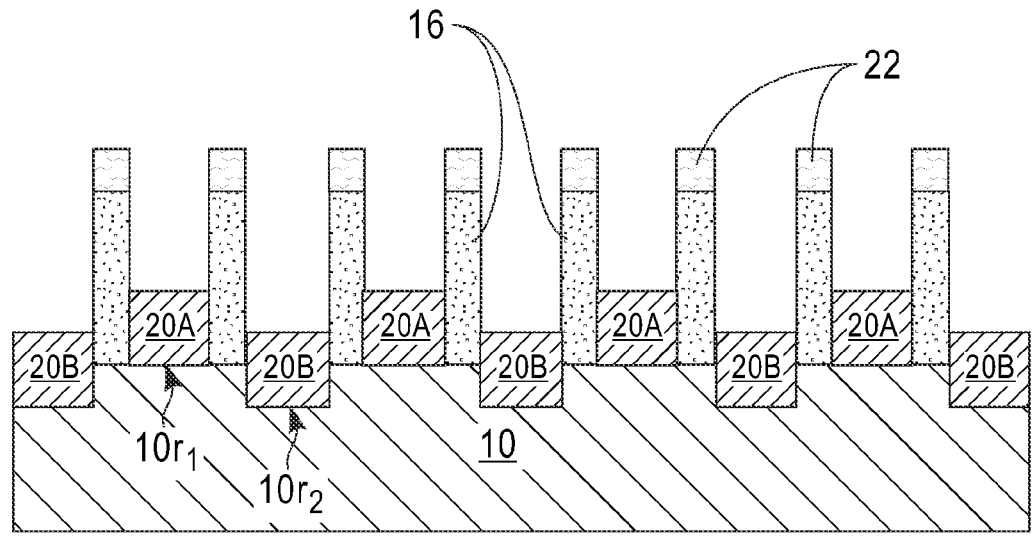
FIG. 7 is a pictorial representation (through a cross sectional view) illustrating the structure of FIG. 6 after forming oxide regions on the first and second recessed surfaces of the semiconductor substrate and an oxide cap on each semiconductor mandrel structure.

Referring now to FIG. 7, there is illustrated the structure of FIG. 6 after forming first oxide regions 20A on each first recessed surfaces $10r_1$ of the semiconductor substrate 10, second oxide regions 20B on each second recessed surface $10r_2$ of the semiconductor substrate 10, and an oxide cap 22 on each semiconductor mandrel structure 16.

As is shown, a topmost surface of each second oxide region 20B that is present on the second recessed surface $10r_2$ of the semiconductor substrate 10 is vertically offset and located beneath a topmost surface of each first oxide region 20A that is present on the first recessed surface $10r_1$ of the semiconductor substrate. As is also shown, a bottommost surface of each second oxide region 20B directly contacts the second recessed surface $10r_2$ of the semiconductor substrate 10 and the bottommost surface of each first oxide region 20A directly contacts the first recessed surface $10r_1$ of the semiconductor substrate 10. As is further shown in FIG. 7, sidewall surfaces of each of the first and second oxide regions 10A, 20B directly contact vertical sidewalls of each semiconductor mandrel structure 16. The first and second oxide regions 10A, 20B can be referred to as first and second oxide pedestals, respectively.

The oxide cap 22 that can be formed is present on a topmost surface of each semiconductor mandrel structure 16 and it has sidewall sidewalls that are vertically coincident to vertical sidewalls of each semiconductor mandrel structure 16.

The first oxide region 20A, the second oxide region 20B and the oxide cap 22 can be formed by a directional deposition process. In one embodiment of the present application, the direction deposition process may comprise a high density plasma process. The term "high density" denotes a process where the ion flux to the surface is larger than the net deposition flux, which means that as the film is deposited it is sputtered by the ions. The sputtering profile is in a such a way that a directional deposition is obtained, i.e., the highest deposition rate is obtained on horizontal surfaces while the lowest deposition rate is obtained on vertical surfaces. In other embodiments, other directional deposition processes such as, for example, physical vapor deposition can be employed.

In one embodiment of the present application, the height of each of the first and second oxide regions 20A, 20B, as measured from a bottommost surface to a topmost surface of each oxide region can be from 30 nm to 150 nm. In another embodiment of the present disclosure, the height of each of the first and second oxide regions 20A, 20B, as measured from a bottommost surface to a topmost surface of each oxide region can be from 30 nm to 50 nm. Other heights are also possible so long as the height of each first and second oxide region 20A, 20B does not extend above the topmost surface of each semiconductor mandrel structure.

In some embodiments, not illustrated, at least one block mask can be formed on portions of the structure shown in FIG. 7 such that an oxide region is formed only on one of the recessed semiconductor surfaces of semiconductor substrate 10. In one embodiment, only the first oxide region 20A is formed on the first recessed surface $10r_1$ and no oxide region is formed on the second recessed surface $10r_2$. In another embodiment, only the second oxide region 20B is formed on the second recessed surface $10r_2$ and no oxide region is formed on the first recessed surface $10r_1$.

Figure 8:
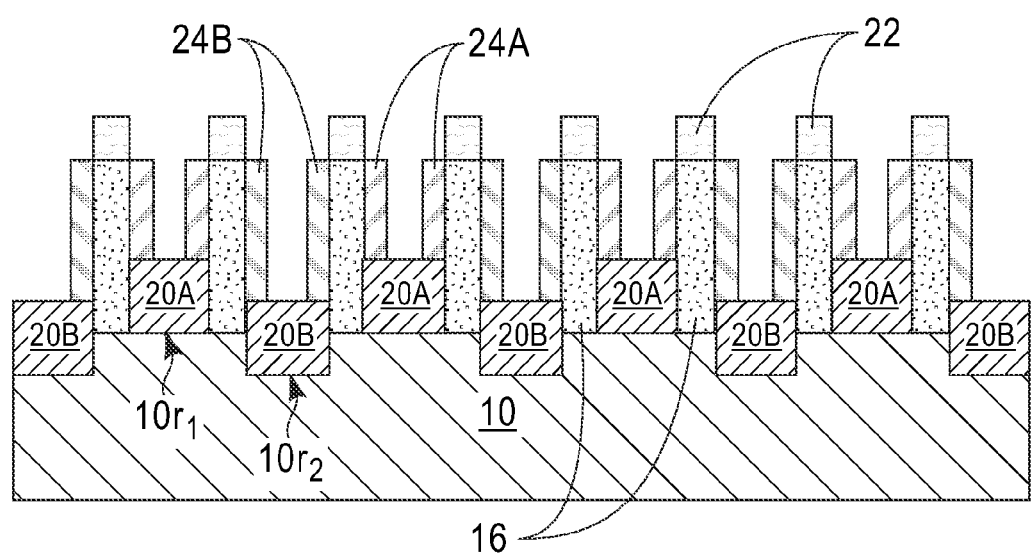
FIG. 8 is a pictorial representation (through a cross sectional view) illustrating the structure of FIG. 7 after forming semiconductor fins on each oxide region and on sidewall surfaces of each semiconductor mandrel structure.

Referring now to FIG. 8, there is illustrated the structure of FIG. 7 after forming semiconductor fins on each oxide region 20A, 20B and on sidewall surfaces of each semiconductor mandrel structure 16. The semiconductor fins that are formed on first oxide regions 20A can be referred to as first semiconductor fins 24A having a first height, $h_1$, while the semiconductor fins that are formed on the second oxide regions 20B can be referred to herein as second semiconductor fins 24B having a second height, $h_2$, wherein the second height is different than the first height. In one embodiment and as shown in the drawings, the second height is greater than the first height. In other embodiments, the second height is less than the first height. In the FIG. 8, the first semiconductor fins 24A define a set of shorter semiconductor fins than the second semiconductor fins 24B.

In some embodiments, each first semiconductor fin 24A may comprise a same or different semiconductor material provided that the semiconductor material of each first semiconductor fin 24A is different from the semiconductor material used in providing the semiconductor mandrel structures 16. Likewise, each second semiconductor fin 24B may comprise a same or different semiconductor material provided that the semiconductor material of each second semiconductor fin 24B is different from the semiconductor material used in providing the semiconductor mandrel structures 16.

In some other embodiments, each first semiconductor fin 24A may comprise a first semiconductor material, while each second semiconductor fin 24B may comprise a second semiconductor material, wherein the first and second semiconductor materials can be the same or different. Typically, each first semiconductor fin 24A and each second semiconductor fin 24B comprise a same semiconductor material which differs from that of the semiconductor material used in providing the semiconductor mandrel structures 16. In one example, and when each semiconductor mandrel structure 16 comprises a silicon germanium alloy, each first semiconductor fin 24A and each second semiconductor fin 24B comprises silicon. In another example, and when each semiconductor mandrel structure 16 comprises a silicon germanium alloy, each first semiconductor fin 24A comprises SiGe with Ge atomic concentration smaller than that of the semiconductor mandrel structure 16 and each second semiconductor fin 24B comprises silicon.

In some embodiments, each first semiconductor fin 24A and each second semiconductor fin 24B comprises an intrinsic, i.e., non-doped semiconductor material. In other embodiments, each first semiconductor fin 24A and each second semiconductor fin 24B comprises a doped semiconductor material. When doped an n-type or a p-type dopant can be introduced into each first semiconductor fin 24A and each second semiconductor fin 24B. It is also within an embodiment of the present application to include some doped semiconductor fins (semiconductor fins 24A and/or second semiconductor fin 24B) and some intrinsic semiconductor fins (the remainder of the first semiconductor fins 24A and/or second semiconductor fin 24B). When doped, a p-type or n-type dopant can be present with the semiconductor fins 24A, 24B.

In some embodiments, each first semiconductor fin 24A and each second semiconductor fin 24B have a same crystal orientation as that of the sidewall surfaces of each semiconductor mandrel structure 16. Each first semiconductor fin 24A and each second semiconductor fin 24B can be formed by an epitaxial growth process including the one described above in forming each semiconductor mandrel structure 16. When a dopant is present, an in-situ epitaxial growth process can be used. Alternatively, doping can be achieved by ion implantation or gas phase doping.

In one embodiment, each first semiconductor fin 24A and each second semiconductor fin 24B that is formed has a width, as measured from one vertical sidewall surface to an opposing vertical sidewall surface, of from 5 nm to 20 nm. In another embodiment, each first semiconductor fin 24A and each second semiconductor fin 24B that is formed has a width, as measured from one vertical sidewall surface to an opposing vertical sidewall surface, of from 5 nm to 10 nm. In some embodiments, the width of the first and second semiconductor fins 24A, 24B can be the same. In another embodiment, variable widths can be achieved for the first and second semiconductor fins 24A, 24B.

As is shown in FIG. 8, each first semiconductor fin 24A and each second semiconductor fin 24B have topmost surfaces which are coplanar with each other and coplanar with a topmost surface of each semiconductor mandrel structure 16. Thus, despite the first semiconductor fins 24A having a different height than the second semiconductor fins 24B, each of the variable height fins 24A, 24B has a same topography, i.e., coplanar surfaces. Also, and in the embodiment illustrated, each of the first and second semiconductor fins are present on an insulator, i.e., oxide regions 20A, 20B, as such the first and second semiconductor fins of the illustrated embodiment may be referred to as SOI fins.

Figure 9A:
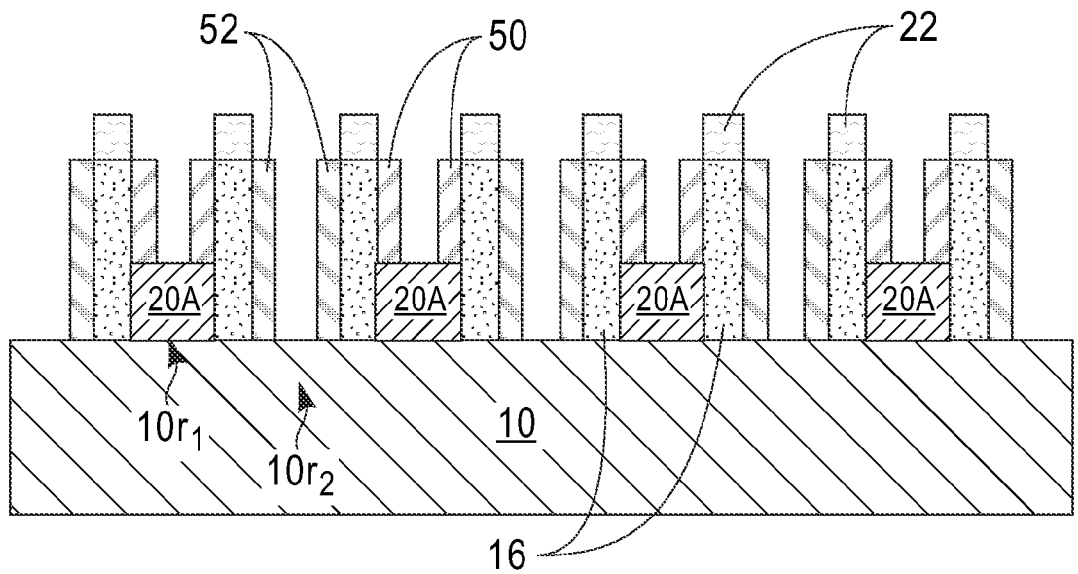
FIG. 9A-9B are pictorial representations (through cross sectional views) illustrating some exemplary fin-containing structures that can be formed in the present application in which an oxide region is formed only on one of the recessed surfaces, but not the other recessed surface.
Figure 9B:
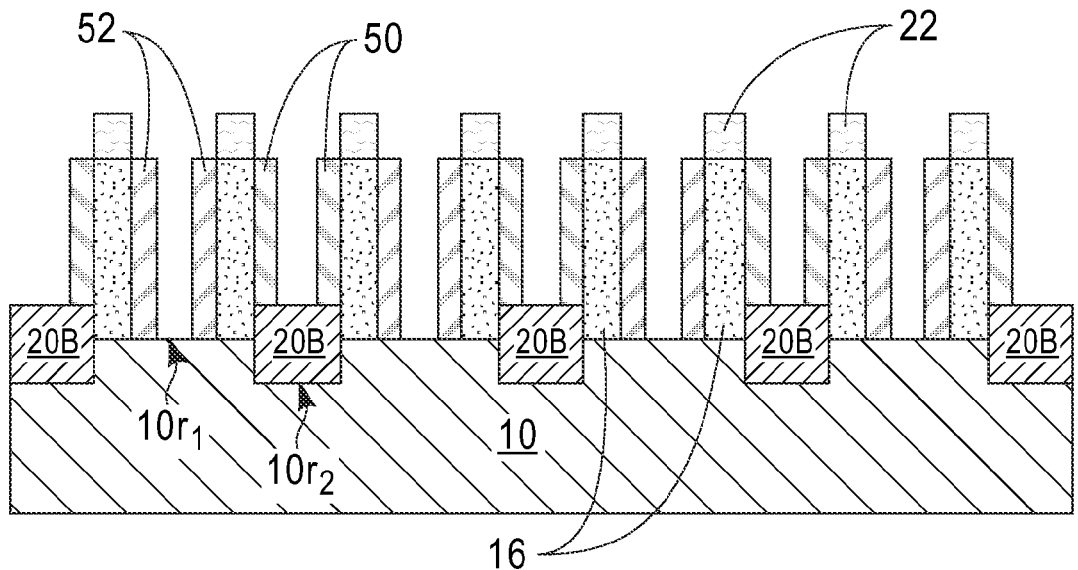

In embodiments in which one of the oxide regions 20A, 20B is not formed, then a corresponding same fin is formed directly on the recessed semiconductor surface of the semiconductor substrate not including the oxide region. In such an embodiment, SOI fins and non-SOI fins of variable height are formed, yet each fin has a same topography, i.e., the topmost surfaces of the SOI fins and non-SOI fins are coplanar with each other. See, for example, FIGS. 9A and 9B. In FIGS. 9A and 9B the SOI fins are labeled as element 50, while the non-SOI fins are labeled as 52. In FIG. 9A and FIG. 9B, the SOI fins 50 are shorter than the non-SOI fins 52.

Figure 10:
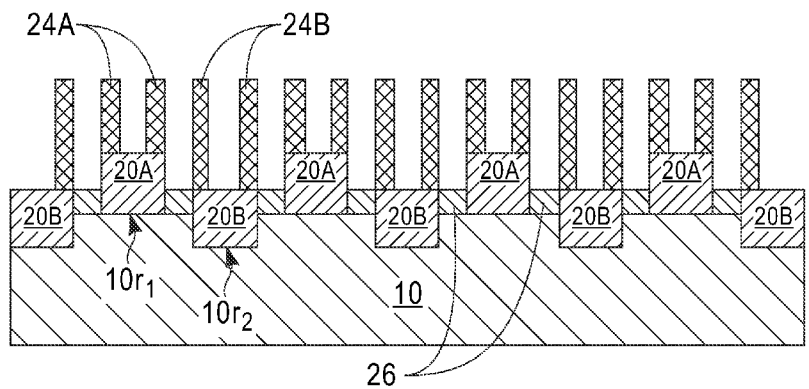
FIG. 10 is a pictorial representation (through a cross sectional view) illustrating the structure of FIG. 8 after removing each of the semiconductor mandrel structures and forming an insulating layer on exposed surfaces of the semiconductor substrate previously occupied by the semiconductor mandrel structures.

Referring now to FIG. 10, there is illustrated the structure of FIG. 8 after removing each oxide cap 22 and each semiconductor mandrel structure 16 and forming an insulating layer 26 on exposed first recessed surfaces $10r_1$ of the semiconductor substrate previously occupied by the semiconductor mandrel structures 16. It is noted that the structures shown in FIGS. 9A-9B may be processed in a like manner as that of the structure shown in FIG. 10.

Each oxide cap 22 is removed from the structure by a planarization process such as, for example, chemical mechanical polishing, so as to expose a topmost surface of each semiconductor mandrel structure 16. Each exposed semiconductor mandrel structure 16 is then selectively removed relative to semiconductor material and oxide. In one embodiment, each exposed semiconductor mandrel structure 16 can be removed by a dry etch process such as, for example, a reactive ion etch. In another embodiment of the present application, a chemical wet etch process such as, for example, a $H_2O_2$-based etch, may be used to selectively remove each semiconductor mandrel structure 16.

As shown in FIG. 10, a pair of a first semiconductors fin 24A of the first height is present on a first oxide region 20A and a pair of second semiconductor fins 24B of the second height is present on second oxide region 20B. As also shown in FIG. 10, each first semiconductor fin 24A of the first height, and each second semiconductor fin 24B of the second height have topmost surfaces that are coplanar with each other. Thus, a structure having variable height semiconductor fins, without any topography is provided.

Figure 11:
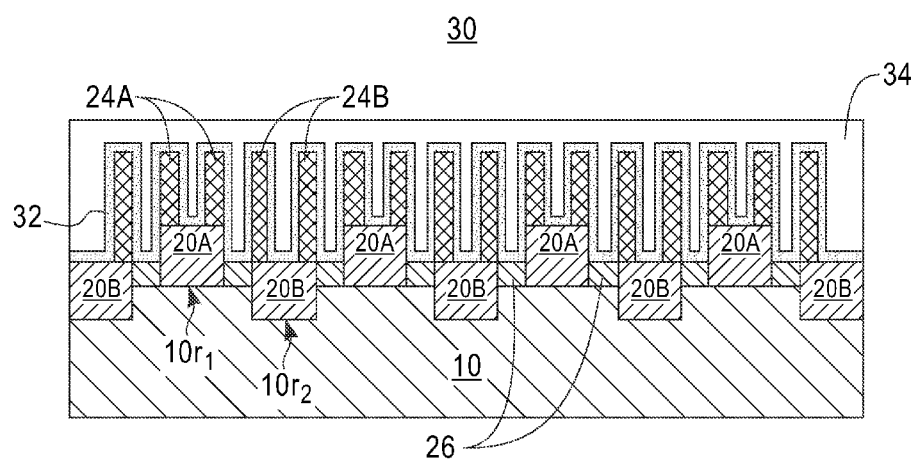
FIG. 11 is a pictorial representation (through a cross sectional view) illustrating the structure of FIG. 10 after forming a gate structure straddling each semiconductor fin.

Referring now to FIG. 11, there is illustrated the structure of FIG. 10 after forming a gate structure 30 straddling each semiconductor fin 24A, 24B. The gate structure 30 includes a gate dielectric 32 and a gate electrode 34.

In some embodiments, the gate dielectric 32 can be a dielectric material having a dielectric constant that is equal to or less than the dielectric constant of silicon oxide. In another embodiment, the gate dielectric 32 can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and/or an alloy thereof. Each value of x is independently from 0.5 to 3 and each value of y is independently from 0 to 2. In some embodiments, a multilayered gate dielectric structure comprising different gate dielectric materials, e.g., silicon oxide, and a high k gate dielectric can be formed.

The gate dielectric 32 can be formed by any deposition technique including, for example, chemical vapor deposition (CVD), plasma enhanced chemical vapor deposition (PECVD), physical vapor deposition (PVD), sputtering or atomic layer deposition. In one embodiment of the present application, the gate dielectric 32 can have a thickness in a range from 1 nm to 10 nm. Other thicknesses that are lesser than or greater than the aforementioned thickness range can also be employed for the gate dielectric 32.

After providing the gate dielectric 32, the gate conductor 34 can be formed atop the gate dielectric 32. In one embodiment, the gate conductor 34 can include any conductive metal material including, for example, an elemental metal (e.g., tungsten, titanium, tantalum, aluminum, nickel, ruthenium, palladium or platinum), an alloy of at least two elemental metals, an elemental metal nitride (e.g., tungsten nitride, aluminum nitride, or titanium nitride), an elemental metal silicide (e.g., tungsten silicide, nickel silicide, or titanium silicide) and multilayered combinations thereof. The gate conductor 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor 46 has a thickness from 1 nm to 100 nm. Other thicknesses that are lesser than or greater than the aforementioned thickness range can also be employed for the gate conductor 34.

In some embodiments a replacement gate process can be used, in which a dummy gate for example comprising of silicon dioxide and polysilicon is first deposited and patterned and is replaced with the desired gate material at a later step in the fabrication process.

In some embodiments, block mask technology can be employed to provide gate structures 30 that include different gate dielectrics 32 and/or different gate conductors 34.

Following the formation of the gate structure 30, gate spacers can be formed on sidewall surfaces of the gate structure 30, and thereafter source/drain regions can be formed into each exposed portion of the first and second semiconductor fins 24A, 24B not including the gate structure 30 or gate spacer. The gate spacers can be formed by deposition of a spacer material such as an oxide and/or nitride, and the etching the deposited spacer material. The source/drain regions can be formed by an angled ion implantation process or gas phase doping. Following the formation of the source/drain regions, end portions of each of the first and semiconductor fins 24A, 24B can be merged by epitaxial deposition of a semiconductor material. The gate spacers, source/drain regions and semiconductor material used in merging the fins are not shown in the drawings so as not to obscure the present application.

FIG. 11 thus shows a semiconductor structure in accordance with an embodiment of the present application that includes a semiconductor substrate 10 comprising a first semiconductor surface (represented by first recessed surface $10r_1$) and a second semiconductor surface (represented by second recessed surface $10r_2$), wherein the first semiconductor surface is vertically offset and located above the second semiconductor surface. An oxide region 20A and/or 20B is located directly on the first semiconductor surface and/or the second semiconductor surface. A first set of first semiconductor fins 24A having a first height is located above the first semiconductor surface of the semiconductor substrate 10. A second set of second semiconductor fins 24B having a second height is located above the second semiconductor surface, wherein the second height is different than the first height and wherein each first semiconductor fin 24A and each second semiconductor fin 24B has a topmost surface, and the topmost surfaces of the first and second semiconductor fins are coplanar with each other. Variations of the structure shown in FIG. 11 can be obtained by using the various embodiments of the present application. For example, variations of the structure shown in FIG. 11 can be obtained using the structure shown in FIG. 9A or 9B instead of the structure shown in FIG. 8.

Figure 12:
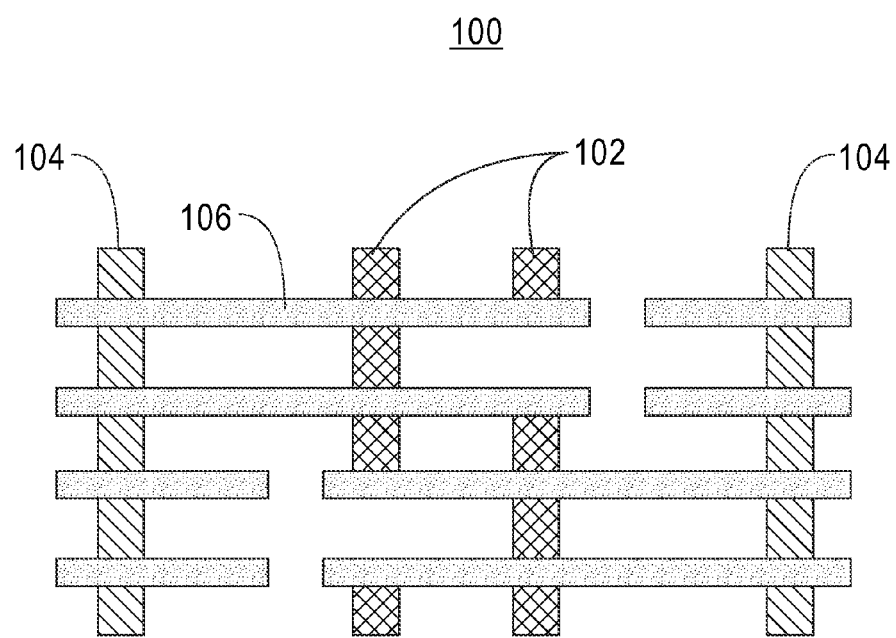
FIG. 12 is a pictorial representation (through a top down view) illustrating a static random access memory (SRAM) device formed using the processing steps of the present application.

FIG. 12 is a pictorial representation (through a top down view) illustrating a static random access memory (SRAM) device 100 formed using the processing steps of the present application. In this drawing, element 102 define semiconductor fins having a first height, element 104 define second semiconductor fins having a second height wherein the second height is greater than the first height, and element 106 defines the gate structure 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The invention claimed is:

1. A semiconductor structure comprising:
a semiconductor substrate comprising a first semiconductor surface and a second semiconductor surface, wherein said first semiconductor surface is vertically offset and located above said second semiconductor surface;
an oxide region located directly on at least one of the first semiconductor surface and the second semiconductor surface;
a first set of first semiconductor fins having a first height and located above said first semiconductor surface of the semiconductor substrate; and
a second set of second semiconductor fins having a second height and located above the second semiconductor surface, wherein the second height is different than the first height and each first semiconductor fin and each second semiconductor fin has a topmost surface, and the topmost surfaces of the first and second semiconductor fins are coplanar with each other, and further wherein one vertical sidewall surface of each first semiconductor fin and each second semiconductor fin that is present on said oxide region is vertically aligned to an outermost vertical edge of said oxide region.

2. The semiconductor structure of claim 1, wherein said oxide region is only located directly on said first semiconductor surface of the semiconductor substrate.

3. The semiconductor structure of claim 1, wherein said oxide region is only located directly on said second semiconductor surface of the semiconductor substrate.

4. The semiconductor structure of claim 1, wherein said oxide region is located directly on both said first semiconductor surface and the second semiconductor surface.

5. The semiconductor structure of claim 1, wherein an insulator layer is located on a portion of the first semiconductor surface not including said first set of first semiconductor fins.

6. The semiconductor structure of claim 1, wherein each semiconductor fin of the first and second sets is comprised of silicon.

7. The semiconductor structure of claim 1, further comprising a gate structure straddling each first semiconductor fin and each second semiconductor fin.

8. The semiconductor structure of claim 7, wherein said gate structure includes a gate dielectric and a gate conductor.

9. The semiconductor structure of claim 8, wherein said gate dielectric is present on each vertical sidewall surface and the topmost surface of each of said first and second semiconductor fins.

10. The semiconductor structure of claim 1, wherein said semiconductor substrate comprises a bulk semiconductor material.

11. A semiconductor structure comprising:
a bulk semiconductor substrate comprising a first semiconductor surface and a second semiconductor surface, wherein said first semiconductor surface is vertically offset and located above said second semiconductor surface;
a first oxide region located directly on the first semiconductor surface;
a second oxide region located directly on the second semiconductor surface, wherein the first oxide region has a topmost surface that is vertically offset and located above a topmost surface of the second oxide region;
a first set of first semiconductor fins having a first height and located directly on the topmost surface of said first oxide region; and
a second set of second semiconductor fins having a second height and located directly on the topmost surface of the second oxide region, wherein the second height is greater than the first height and each first semiconductor fin and each second semiconductor fin has a topmost surface, and the topmost surfaces of the first and second semiconductor fins are coplanar with each other, and further wherein one vertical sidewall surface of each first semiconductor fin is vertically aligned to an outermost vertical edge of said first oxide region and one vertical sidewall surface of each second semiconductor fin is vertically aligned to an outermost vertical edge of said second oxide region.

12. The semiconductor structure of claim 11, wherein an insulator layer is located on a portion of the first semiconductor surface not including said first set of first semiconductor fins.

13. The semiconductor structure of claim 11, wherein each semiconductor fin of the first and second sets is comprised of silicon.

14. The semiconductor structure of claim 11, further comprising a gate structure straddling each first semiconductor fin and each second semiconductor fin.

15. The semiconductor structure of claim 14, wherein said gate structure includes a gate dielectric and a gate conductor.

16. The semiconductor structure of claim 15, wherein said gate dielectric is present on each vertical sidewall surface and the topmost surface of each of said first and second semiconductor fins.

17. The semiconductor structure of claim 12 wherein a topmost surface of said insulator layer is coplanar with a topmost surface of said second oxide structure.

\* \* \* \* \*